United States Patent
Pendse

(10) Patent No.: US 8,143,108 B2
(45) Date of Patent: Mar. 27, 2012

(54) SEMICONDUCTOR DEVICE AND METHOD OF DISSIPATING HEAT FROM THIN PACKAGE-ON-PACKAGE MOUNTED TO SUBSTRATE

(75) Inventor: Rajendra D. Pendse, Fremont, CA (US)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/965,584

(22) Filed: Dec. 10, 2010

(65) Prior Publication Data

US 2011/0074028 A1    Mar. 31, 2011

Related U.S. Application Data

(63) Continuation-in-part of application No. 10/960,893, filed on Oct. 7, 2004.

(51) Int. Cl.
*H01L 23/373* (2006.01)
(52) U.S. Cl. .................. 438/125; 257/E23.106
(58) Field of Classification Search .......... 438/107–109, 438/125, 126; 257/E23.106
See application file for complete search history.

(56) References Cited

U.S. PATENT DOCUMENTS

| | | | |
|---|---|---|---|
| 4,654,966 A | 4/1987 | Kohara et al. |
| 4,887,760 A | 12/1989 | Yoshino et al. |
| 5,192,835 A | 3/1993 | Bull et al. |
| 5,218,611 A | 6/1993 | Tanaka et al. |
| 5,394,490 A | 2/1995 | Kato et al. |
| 5,468,681 A | 11/1995 | Pasch |
| 5,477,082 A | 12/1995 | Buckley, III et al. |
| 5,535,526 A | 7/1996 | White |
| 5,677,246 A | 10/1997 | Maeta et al. |
| 5,768,109 A | 6/1998 | Gulick et al. |
| 5,798,567 A | 8/1998 | Kelly et al. |
| 5,818,404 A | 10/1998 | Lebby et al. |
| 5,821,627 A | 10/1998 | Mori et al. |
| 5,838,061 A | 11/1998 | Kim |
| 5,846,694 A | 12/1998 | Strand et al. |
| 5,854,507 A | 12/1998 | Miremadi et al. |
| 5,897,341 A | 4/1999 | Love et al. |
| 5,926,371 A | 7/1999 | Dolbear |
| 5,939,783 A | 8/1999 | Laine et al. |
| 5,990,768 A | 11/1999 | Takahashi et al. |

(Continued)

FOREIGN PATENT DOCUMENTS

JP        9186199 A    7/1997

(Continued)

*Primary Examiner* — William D Coleman
*Assistant Examiner* — Daniel Shook
(74) *Attorney, Agent, or Firm* — Robert D. Atkins; Patent Law Group: Atkins & Associates, P.C.

(57) ABSTRACT

A semiconductor device has a first substrate with a central region. A plurality of bumps is formed around a periphery of the central region of the first substrate. A first semiconductor die is mounted to the central region of the first substrate. A second semiconductor die is mounted to the first semiconductor die over the central region of the first substrate. A height of the first and second die is less than or equal to a height of the bumps. A second substrate has a thermal conduction channel. A surface of the second semiconductor die opposite the first die is mounted to the thermal conductive channel of the second substrate. A thermal interface layer is formed over the surface of the second die. The bumps are electrically connected to contact pads on the second substrate. A conductive plane is formed over a surface of the second substrate.

33 Claims, 13 Drawing Sheets

U.S. PATENT DOCUMENTS

| | | | |
|---|---|---|---|
| 6,002,165 | A | 12/1999 | Kinsman |
| 6,025,648 | A | 2/2000 | Takahashi et al. |
| 6,137,164 | A | 10/2000 | Yew et al. |
| 6,138,348 | A | 10/2000 | Kulesza et al. |
| 6,151,173 | A | 11/2000 | Massit et al. |
| 6,166,443 | A | 12/2000 | Inaba et al. |
| 6,189,208 | B1 | 2/2001 | Estes et al. |
| 6,201,266 | B1 | 3/2001 | Ohuchi et al. |
| 6,207,904 | B1 | 3/2001 | Kramer et al. |
| 6,208,025 | B1 | 3/2001 | Bellaar et al. |
| 6,222,740 | B1 | 4/2001 | Bovensiepen et al. |
| 6,255,143 | B1 | 7/2001 | Briar |
| 6,291,264 | B1 * | 9/2001 | Tang et al. ............ 438/106 |
| 6,310,386 | B1 | 10/2001 | Shenoy |
| 6,329,603 | B1 | 12/2001 | Japp et al. |
| 6,339,254 | B1 | 1/2002 | Venkateshwaran et al. |
| 6,340,796 | B1 | 1/2002 | Smith et al. |
| 6,362,525 | B1 | 3/2002 | Rahim |
| 6,362,530 | B1 | 3/2002 | Lee et al. |
| 6,365,963 | B1 | 4/2002 | Shimada |
| 6,373,131 | B1 | 4/2002 | Karnezos |
| 6,376,917 | B1 | 4/2002 | Takeshita et al. |
| 6,437,990 | B1 | 8/2002 | Degani et al. |
| 6,507,121 | B2 | 1/2003 | Huang |
| 6,512,861 | B2 | 1/2003 | Chakravorty et al. |
| 6,566,745 | B1 | 5/2003 | Beyne et al. |
| 6,571,466 | B1 | 6/2003 | Glenn et al. |
| 6,583,515 | B1 | 6/2003 | James et al. |
| 6,737,295 | B2 | 5/2004 | Pendse et al. |
| 6,762,492 | B2 | 7/2004 | Nakajima et al. |
| 6,781,241 | B2 * | 8/2004 | Nishimura et al. ........ 257/777 |
| 6,906,415 | B2 | 6/2005 | Jiang et al. |
| 6,919,508 | B2 | 7/2005 | Forcier |
| 7,038,142 | B2 | 5/2006 | Abe |
| 7,061,122 | B2 | 6/2006 | Kim et al. |
| 7,141,778 | B2 | 11/2006 | Uchida |
| 7,498,678 | B2 | 3/2009 | Gonzalez et al. |
| 2001/0001292 | A1 * | 5/2001 | Bertin et al. ............ 438/107 |
| 2002/0030261 | A1 | 3/2002 | Rolda, Jr. et al. |
| 2002/0079567 | A1 | 6/2002 | Lo et al. |
| 2002/0079568 | A1 | 6/2002 | Degani et al. |
| 2002/0079575 | A1 | 6/2002 | Hozoji et al. |
| 2002/0121706 | A1 | 9/2002 | Tatsuta et al. |
| 2002/0121707 | A1 | 9/2002 | Pendse et al. |
| 2004/0065933 | A1 | 4/2004 | Foong et al. |
| 2004/0070080 | A1 | 4/2004 | Pendse |
| 2004/0106229 | A1 | 6/2004 | Jiang et al. |
| 2004/0218848 | A1 | 11/2004 | Shen et al. |
| 2004/0222440 | A1 | 11/2004 | Pendse et al. |
| 2005/0025409 | A1 | 2/2005 | Welch et al. |
| 2005/0100298 | A1 | 5/2005 | Okubora et al. |
| 2005/0205951 | A1 | 9/2005 | Eskridge |
| 2007/0278655 | A1 | 12/2007 | Gonzalez et al. |
| 2008/0048316 | A1 | 2/2008 | Roberts et al. |

FOREIGN PATENT DOCUMENTS

| | | |
|---|---|---|
| JP | 10284544 A | 10/1998 |
| JP | 10294423 | 11/1998 |
| JP | 11312712 A | 11/1999 |
| JP | 11345897 | 12/1999 |
| JP | 11345897 A | 12/1999 |
| JP | 2000098153 | 4/2000 |
| JP | 2000156457 | 6/2000 |
| JP | 2000286360 A | 10/2000 |
| JP | 2001044358 | 2/2001 |
| JP | 2001044358 A | 2/2001 |
| WO | 99/62135 | 12/1999 |

* cited by examiner

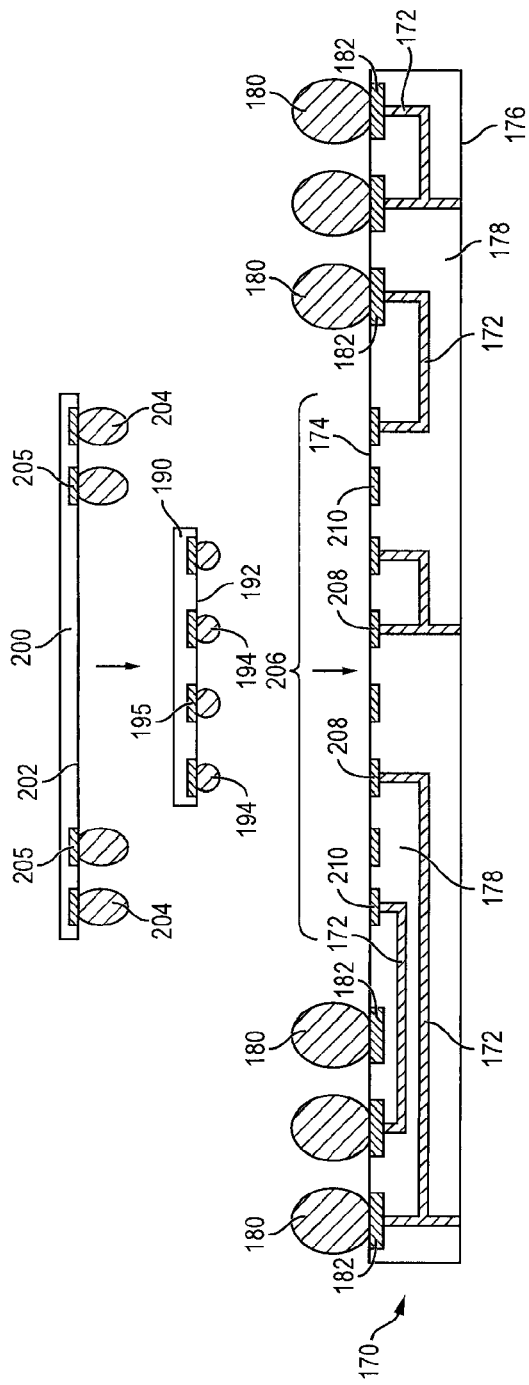
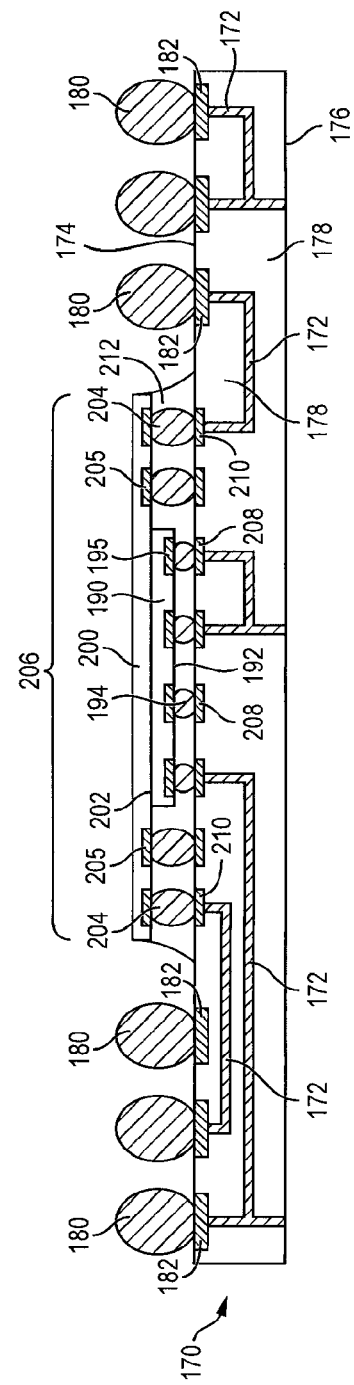
FIG. 7a
FIG. 7b

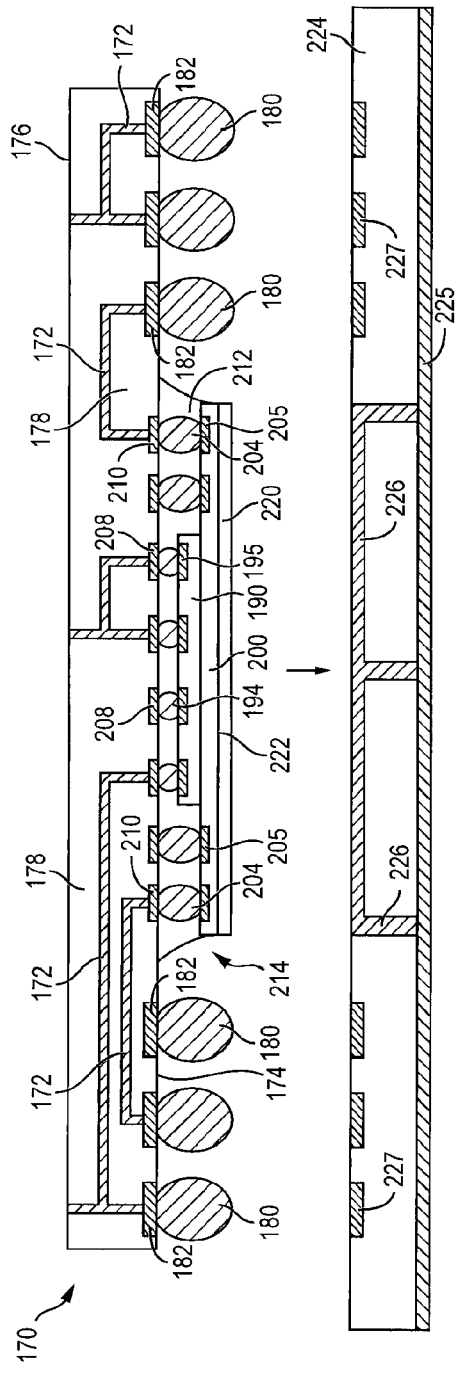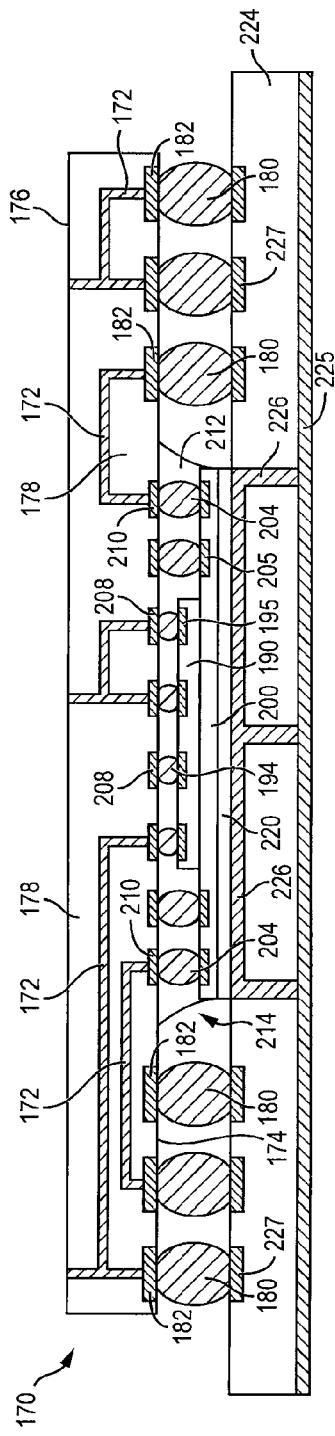

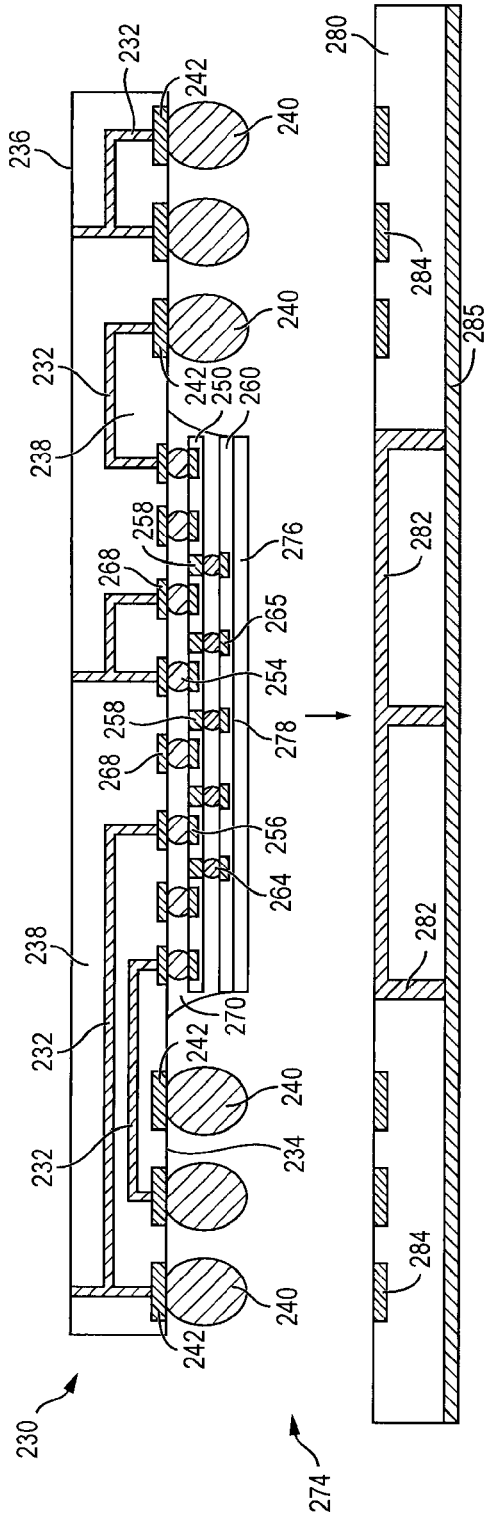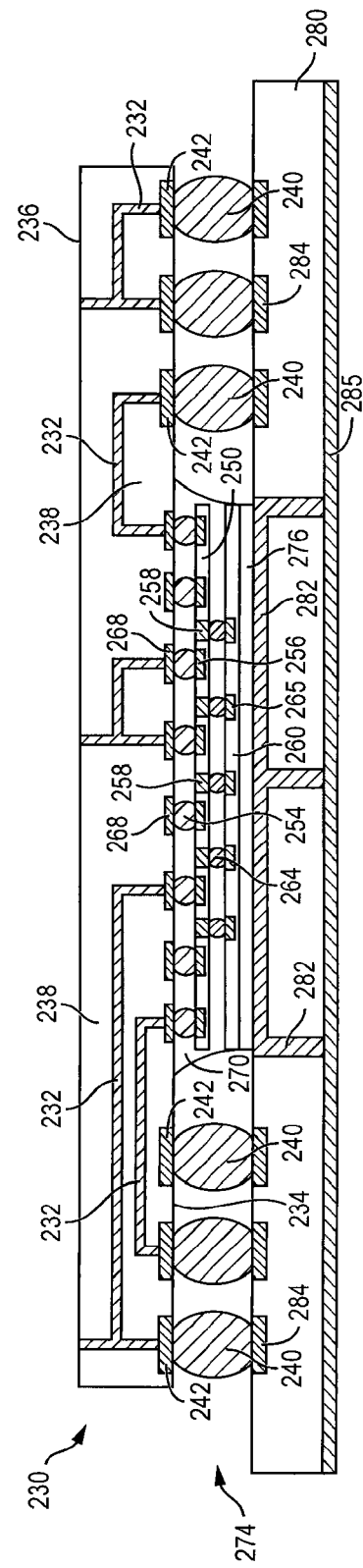
FIG. 8c
FIG. 8d

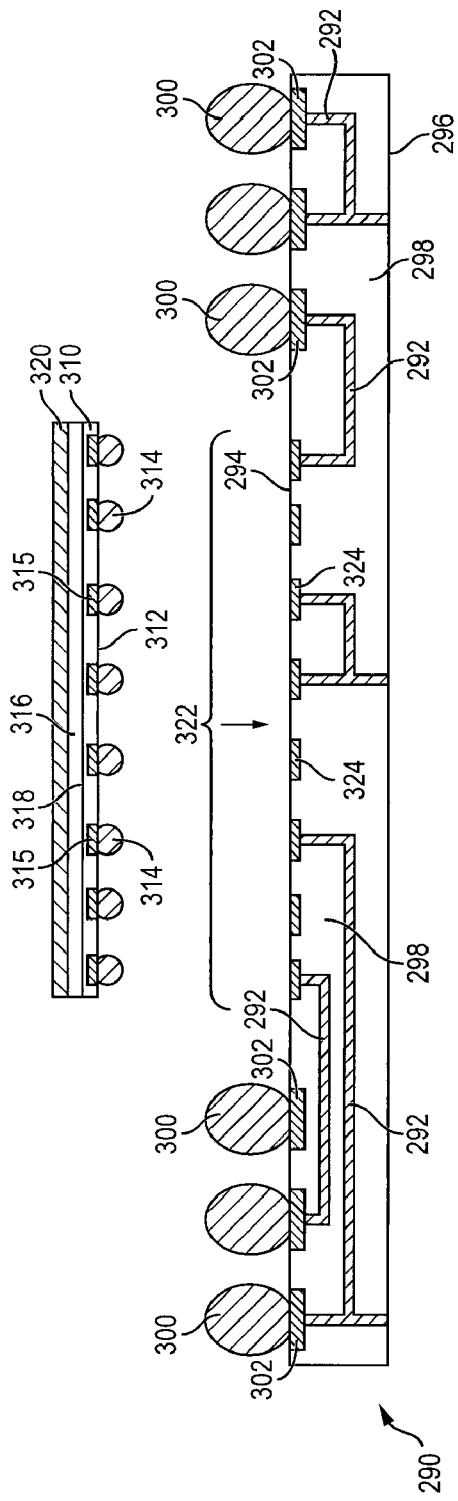
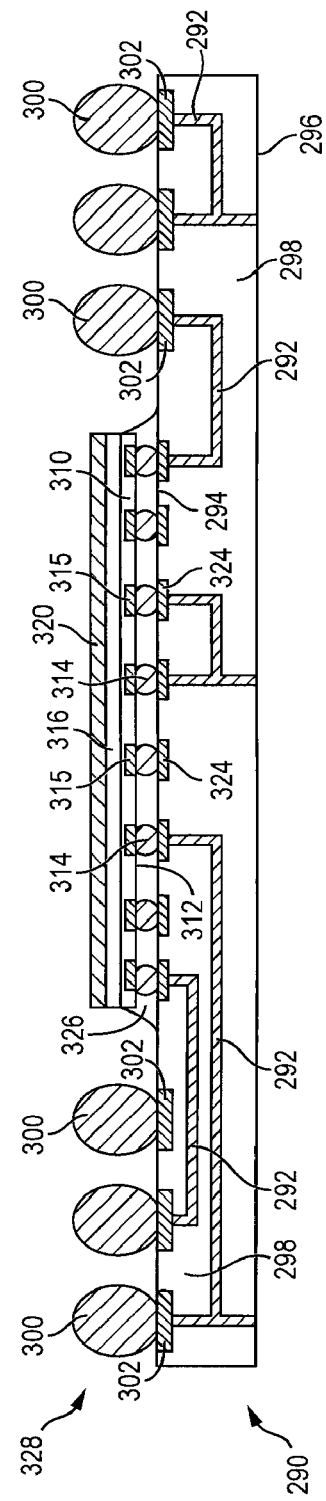
FIG. 9a
FIG. 9b

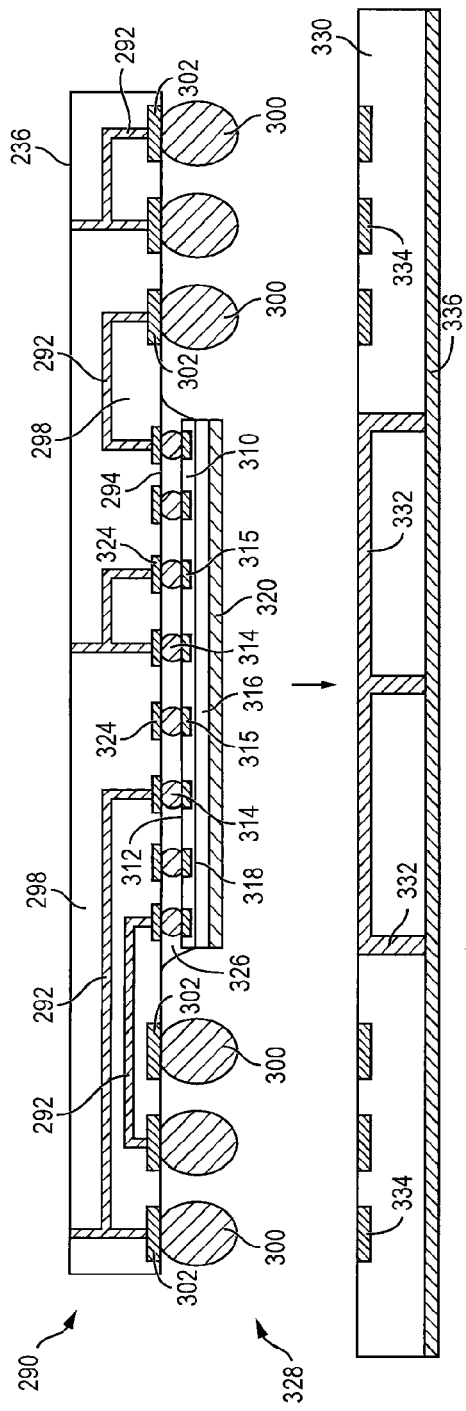
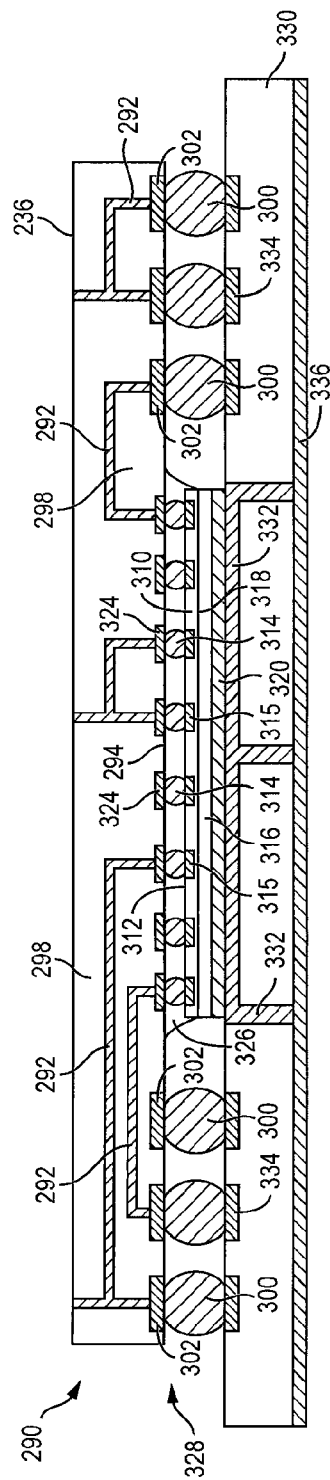
FIG. 9c
FIG. 9d

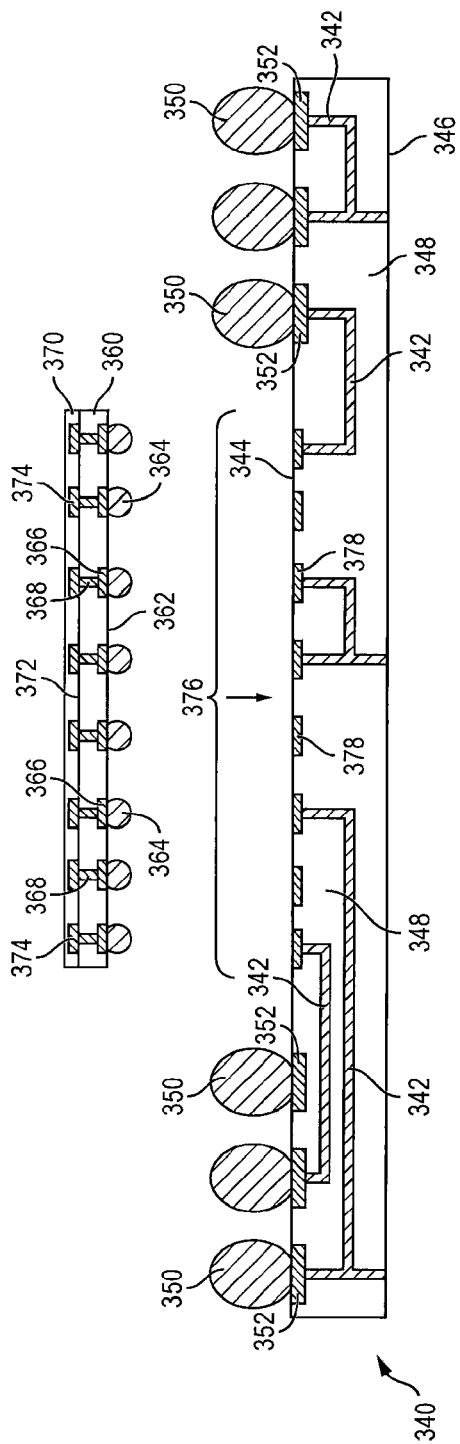
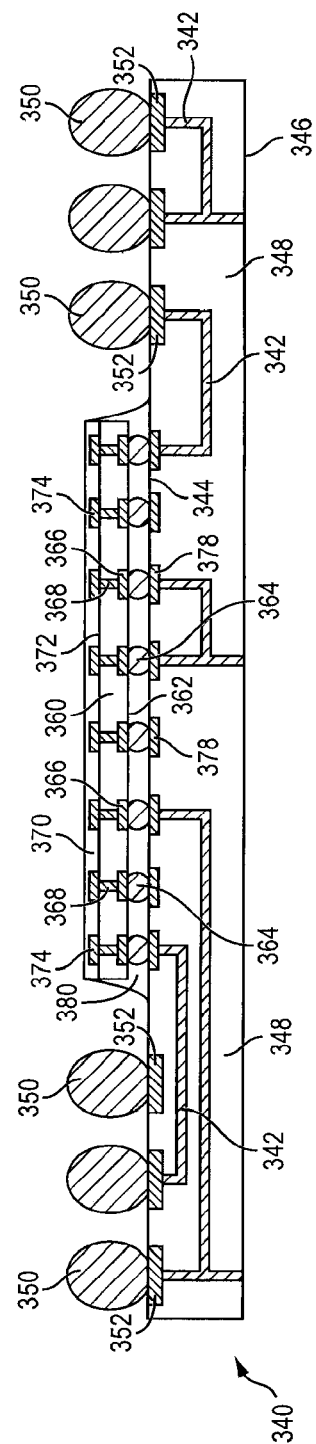
FIG. 10a
FIG. 10b

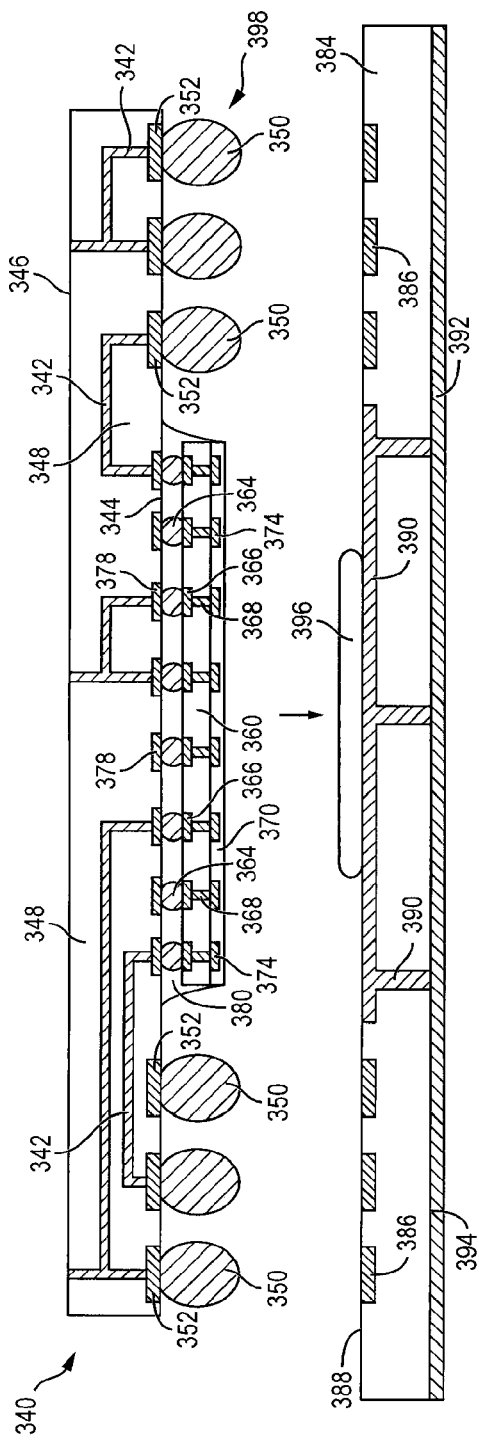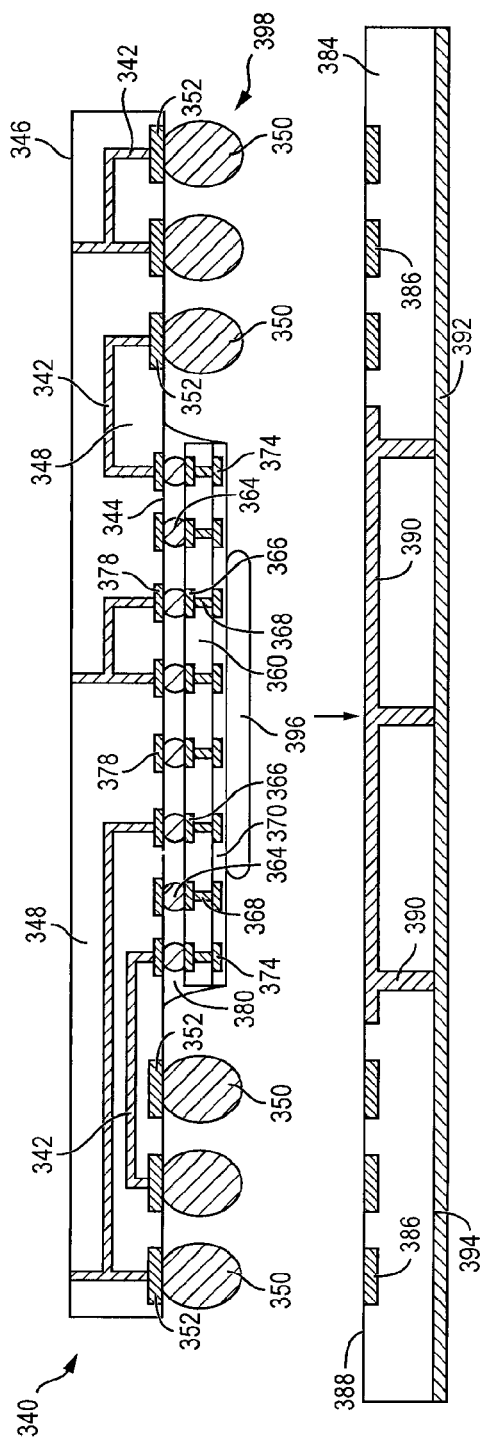
FIG. 10c
FIG. 10d

SEMICONDUCTOR DEVICE AND METHOD OF DISSIPATING HEAT FROM THIN PACKAGE-ON-PACKAGE MOUNTED TO SUBSTRATE

CLAIM TO DOMESTIC PRIORITY

The present application is a continuation-in-part of U.S. application Ser. No. 10/960,893, filed Oct. 7, 2004, and claims priority to the foregoing application pursuant to 35 U.S.C. §120.

FIELD OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce semiconductor devices with adequate heat dissipation. High frequency and high power consumption semiconductor devices generally generate more heat. Without effective heat dissipation, the generated heat can reduce performance, decrease reliability, and reduce the useful lifetime of the semiconductor device.

Chip scale packages housing semiconductor die are in increasing demand in applications such as hand-held or portable electronics and in miniaturized storage devices, such as disk drives. In many such applications, there is a need for such packages to operate at very high frequencies, typically in excess of 1 GHz, to meet the needs of analog or RF devices and of fast memories used in cellular phones. Chip scale packages are in common use in such applications. Chip scale packages conventionally employ wire bonding to electrically connect the semiconductor die and substrate.

FIG. 1 shows a conventional chip scale package 10 with semiconductor die 14 attached to surface 11 of substrate 12. Semiconductor die 14 is electrically connected to substrate 12 by way of bond wires 16 connected between bond wire pads 15 on semiconductor die 14 and interconnect sites 18 on surface 11. Semiconductor die 14, bond wires 16, and surface 11 of substrate 12 are enclosed within and protected by encapsulant 20. A plurality of second level interconnect bumps 22 is attached to interconnect sites 24 on surface 26 of substrate 12, opposite surface 11. Substrate 12 includes electrically conductive traces formed at or near surface 11 and surface 26 for connection with bond wires 16 from semiconductor die 14 and bumps 22. A plurality of vias can be formed through substrate 12 to electrically interconnect features on surfaces 11 and 26.

It is desirable to minimize thickness of the chip scale package. Chip scale packages with bond wire interconnect have an overall package height in the range of 0.6-0.8 millimeters (mm). Further reduction of package thickness is increasingly difficult in part due to the fact that wire bonding interconnection employs wire loops of finite height imposing lower limits on size in the "Z" direction) and finite span imposing lower limits on size in the "X" and "Y" directions. The bond wires are routed from bond pads at the upper surface of the die, up and then across and down to bond sites on the upper surface of the substrate onto which the die is attached. The bond wires are enclosed with a protective encapsulating material. The bond wires and encapsulation typically contribute about 0.2-0.4 mm to the package thickness. In addition, as chip scale packages are made thinner, the second level interconnections between the package and the printed circuit board are less reliable. In particular, second level interconnections that lie under the footprint of the semiconductor die are most adversely affected.

Moreover, improvement of electrical performance presents significant challenges because of the difficulty in reducing the signal path length, as the bond wires typically have a length about 1.0 mm. The structure of the package necessitates wrap-around routing of conductive traces as the traces fan outward to vias and run back inward to the bump locations.

SUMMARY OF THE INVENTION

A need exists for a package structure that circumvents the above obstacles and provides for further package miniaturization, improved high-speed operation, and effective power dissipation. Accordingly, in one embodiment, the present invention is a method of making a semiconductor device comprising the steps of providing a first substrate having a central region, forming a plurality of bumps around a periphery of the central region of the first substrate, mounting a first semiconductor die to the central region of the first substrate, and mounting a second semiconductor die to the first semiconductor die over the central region of the first substrate. A height of the first and second semiconductor die is less than or equal to a height of the bumps. The method further includes the steps of providing a second substrate having a thermal conduction channel, mounting a surface of the second semiconductor die opposite the first semiconductor die to the thermal conductive channel of the second substrate with a thermal interface material, and electrically connecting the bumps to contact pads on the second substrate.

In another embodiment, the present invention is a method of making a semiconductor device comprising the steps of providing a first substrate, mounting a first semiconductor die to the first substrate, mounting a second semiconductor die to the first semiconductor die over the first substrate, and forming a plurality of bumps over the first substrate around a periphery of the first and second semiconductor die. A height of the first and second semiconductor die is less than or equal to a height of the bumps. The method further includes the steps of providing a second substrate having a thermal conduction channel, and mounting a surface of the second semiconductor die opposite the first semiconductor die to the thermal conductive channel of the second substrate with a thermal interface material.

In another embodiment, the present invention is a method of making a semiconductor device comprising the steps of providing a first substrate, mounting a first semiconductor die to the first substrate, and forming a plurality of bumps over the first substrate around a periphery of the first semiconductor die. A height of the first semiconductor die is less than or equal to a height of the bumps. The method further includes the steps of providing a second substrate having a thermal conduction channel, and mounting a surface of the first semiconductor die to the thermal conductive channel of the second substrate with a thermal interface material.

In another embodiment, the present invention is a semiconductor device comprising a first substrate and first semiconductor die mounted to the first substrate. A second semiconductor die is mounted to the first semiconductor die over the first substrate. A plurality of bumps is formed over the first substrate around a periphery of the first and second semiconductor die. A height of the first and second semiconductor die is less than or equal to a height of the bumps. A second substrate has a thermal conduction channel. A surface of the second semiconductor die opposite the first semiconductor die is mounted to the thermal conductive channel of the second substrate with a thermal interface material.

BRIEF DESCRIPTION OF THE DRAWINGS

FIGS. 7a-7e illustrate a process of dissipating heat from a thin PoP through a TIM to a substrate;

FIGS. 8a-8d illustrate another process of dissipating heat from a thin PoP through a TIM to a substrate;

FIGS. 9a-9d illustrate a heat distributing layer for dissipating heat from a thin semiconductor die mounted to a substrate;

FIGS. 10a-10e illustrate depositing TIM over the semiconductor die or substrate.

DETAILED DESCRIPTION OF THE DRAWINGS

Figure 1:
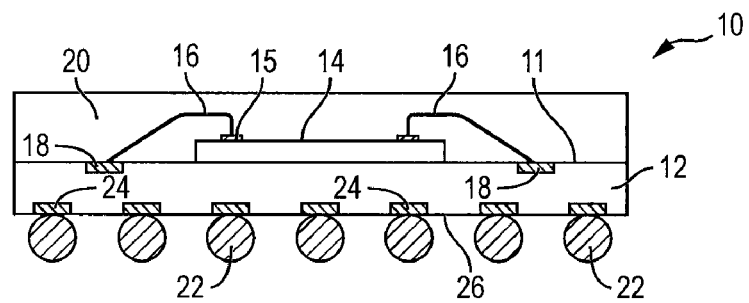
FIG. 1 is a sectional view of a conventional chip scale package having bond wire interconnection.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
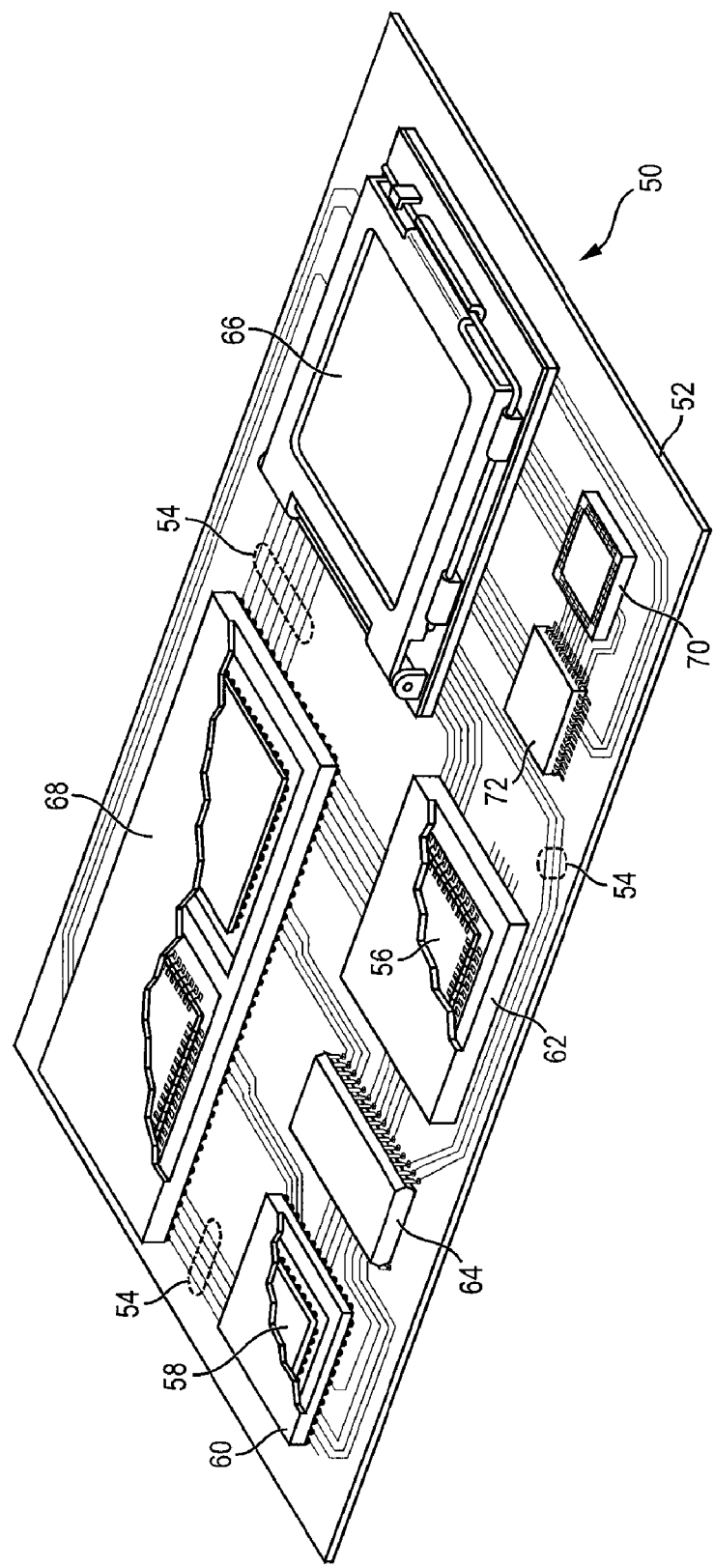
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
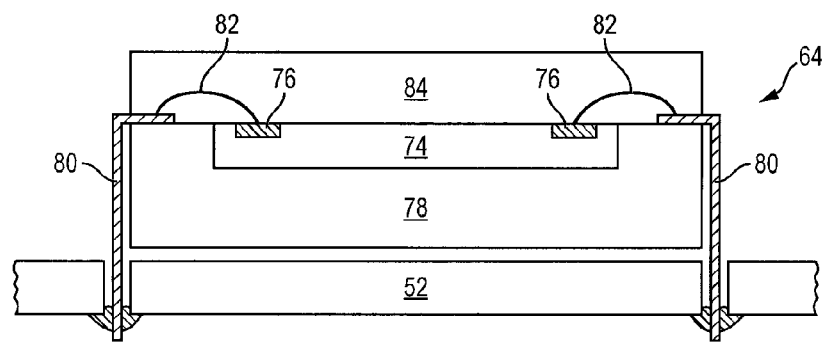
FIGS. 3a-3c illustrate further detail of the representative semiconductor packages mounted to the PCB.
Figure 3B:
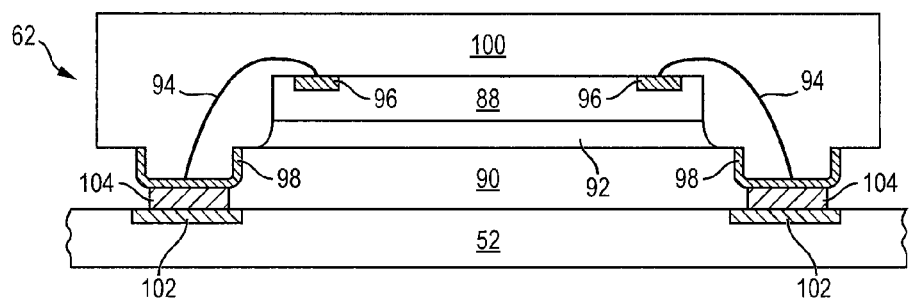
Figure 3C:
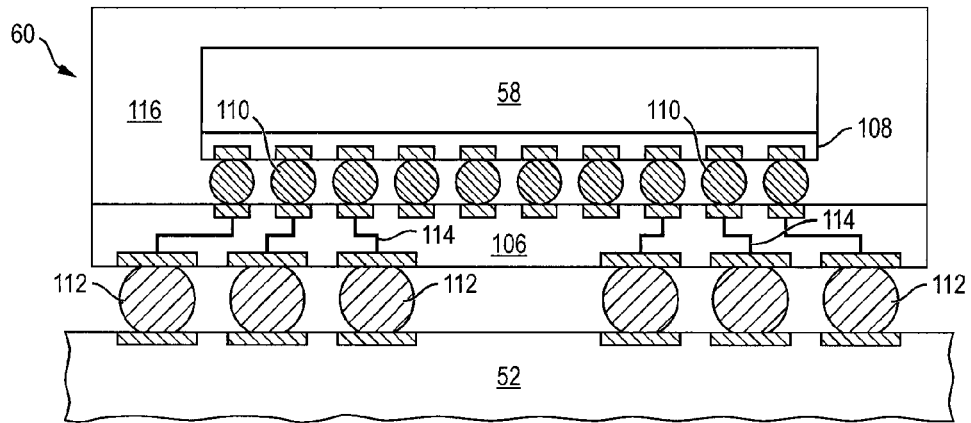

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4:
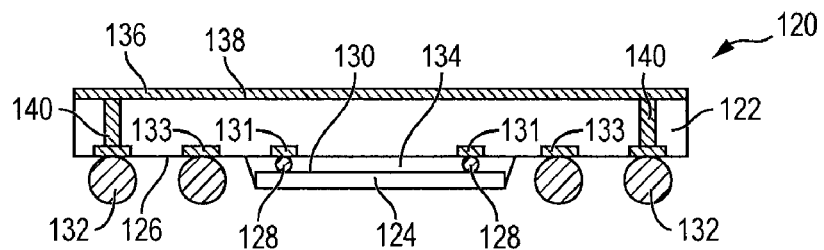
FIG. 4 is a sectional view of an embodiment of a thin high speed chip scale package.

FIG. 4 illustrates a chip scale package 120 having substrate 122 and flipchip semiconductor die 124 mounted to surface 126 of the substrate using bumps 128. The electrical interconnection between semiconductor die 124 and substrate 122 is made by way of bumps 128 and a plurality of conductive traces formed on active surface 130. Bumps 128 are formed on contact pads on active surface 130 and electrically connected to interconnect sites 131 on substrate 122 in a solid-state fashion, that is, the bumps are thermo-mechanically connected to interconnect sites 131 by concurrently forcing the bumps against the interconnect sites and applying sufficient heat to deform the bump against the interconnect site without melting either the bump material or interconnect site material. The solid-state interconnect can provide for interconnect geometries in ranges less than 0.1 mm pitch. The solid-state bonds provide finer interconnect geometries with a high input/output (I/O) count than can be obtained using a melt-bond connection. Bumps 128 can also be reflowed to metallurgically and electrically connect to interconnect sites 131.

A plurality of bumps 132 is formed over contact pads 133 on surface 126. In this embodiment, semiconductor die 124 is located in a center region of substrate 122 and bumps 132 are arranged around a peripheral region of semiconductor die 124 to the edge of the substrate. An underfill material or epoxy-resin adhesive material 134 is deposited in the thin gap between substrate 122 and semiconductor die 124. In one embodiment, the gap between substrate 122 and active surface 130 is less than about 0.025 mm. Substrate 122 includes a plurality of conductive traces formed on surface 126 to electrically connect bumps 128 and 132. One or more of the conductive traces on substrate 122 can be formed as coplanar waveguides, in which ground lines are formed to run alongside the signal line on a planar dielectric material.

The dimensions of the various features can be selected to minimize the overall thickness of the chip scale package. Chip scale package 120 achieves miniaturization and high-speed operation by employing a flipchip interconnection between substrate 122 and semiconductor die 124, and further by mounting the semiconductor die on the same side of the substrate as bumps 132, which provide a second level interconnect. For example, the thickness of substrate 122 can be 0.1 mm, the height of semiconductor die 124 can be 0.18 mm, and the height of bumps 132 can be 0.3 mm with a 0.5 mm pitch, to yield an overall package height of approximately 0.4 mm. Accordingly, the combined thickness of semiconductor die 124 and the gap is less than or equal to the height of bumps 132 so that the effective die thickness is accommodated within the second level interconnect, and contributes nothing to the overall package thickness ("Z" direction miniaturization). With no bumps 132 within the footprint of semiconductor die 124, the second level interconnect reliability is superior to that of conventional chip scale packages having bumps within the footprint of the die. Moreover, the length of the longest conductive trace between bumps 128 and bumps 132 is less that 1.0 mm, which provides enhanced electrical performance.

An optional ground plane 136 is formed over surface 138 of substrate 122, opposite surface 126. Ground plane 136 can be a continuous metal sheet, e.g., Cu, substantially covering surface 138. One or more conductive vias 140 are formed through substrate 122 to electrically connect ground plane 136 through bumps 132 to a low-impedance ground point.

Figure 5:
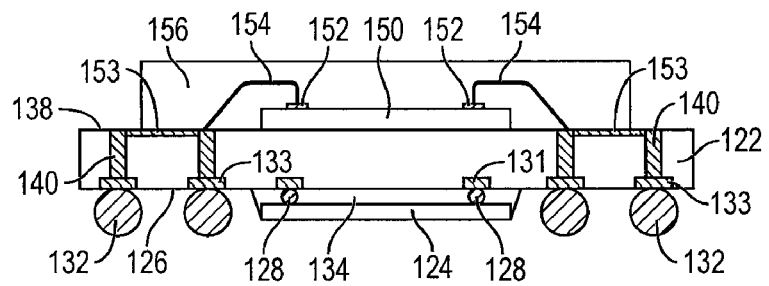
FIG. 5 is a sectional view of another embodiment of a thin high speed chip scale package.

FIG. 5 shows an embodiment, continuing from FIG. 4, with a semiconductor die 150 mounted to surface 138 of substrate 122 with a die attach adhesive. Semiconductor die 150 has contact pads 152 electrically connected to conductive traces 153 formed on surface 138 and conductive vias 140 with bond wires 154. Semiconductor die 150 is thus electrically connected to semiconductor die 124 and bumps 132. An encapsulant 156 is deposited over surface 138, semiconductor die 150, and bond wires 154.

Figure 6:
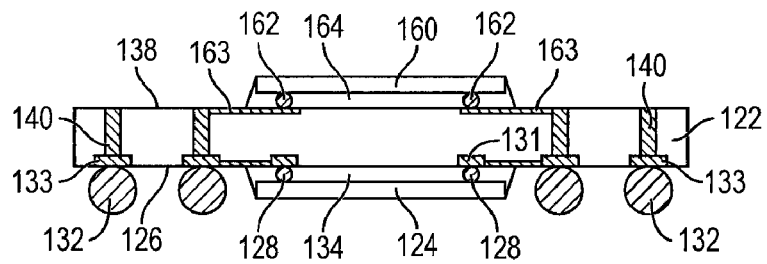
FIG. 6 is a sectional view of still another embodiment of a thin high speed chip scale package.

FIG. 6 shows an embodiment, continuing from FIG. 4, with a flipchip semiconductor die 160 mounted to surface 138 of substrate 122 using bump 162. Bumps 162 are electrically connected to conductive traces or redistribution layer (RDL) 163 formed on surface 138 and conductive vias 140. Semiconductor die 160 is thus electrically connected to semiconductor die 124 and bumps 132. An underfill material or epoxy-resin adhesive material 164 is deposited between substrate 122 and semiconductor die 160.

Figure 7E:
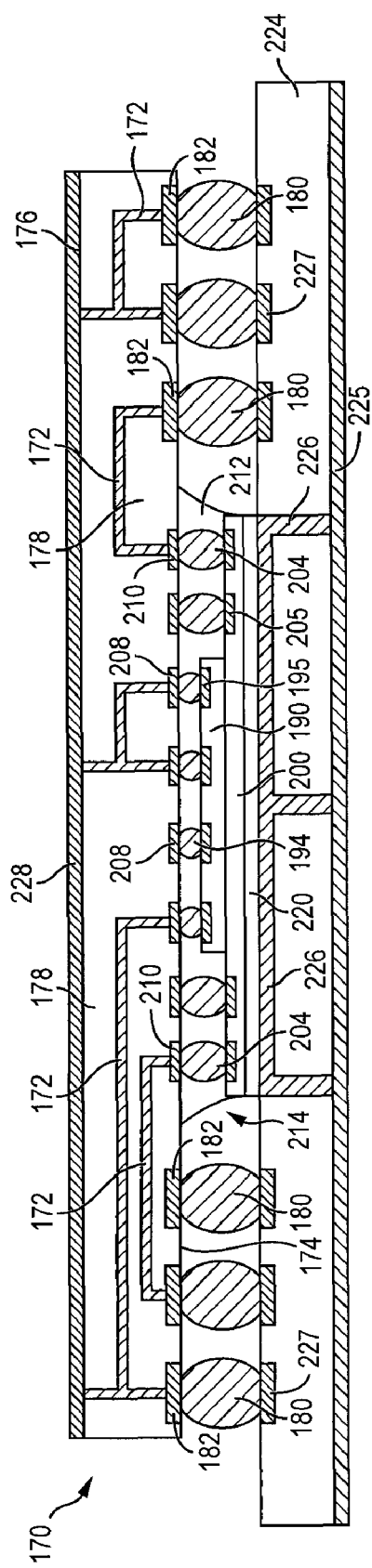

FIGS. 7a-7e illustrate, in relation to FIGS. 2 and 3a-3c, a process of dissipating heat from a thin PoP mounted to a substrate. FIG. 7a shows a substrate 170 having electrically conductive layers or traces 172 formed over and through the substrate to provide electrical interconnect according to the electrical design and function of semiconductor die 190 and 200. The conductive layers and traces 172 extend across surface 174 of substrate 170 and through the substrate between opposing surfaces 174 and 176 with electrical separation by insulating material 178. A plurality of bumps 180 is formed over contact pads 182 on surface 174 and electrically connected to conductive traces 172.

A semiconductor die 190 has an active surface 192 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 192 to implement analog circuits or digital circuits, such as digital signal processor (DSP), central processing unit (CPU), ASIC, memory, or other signal processing circuit. Semiconductor die 190 can also contain IPDs, such as inductors, capacitors, and resistors, for RF signal processing. A plurality of bumps 194 is formed over contact pads 195 on active surface 192 for electrical interconnect.

A semiconductor die 200 has an active surface 202 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 202 to implement analog circuits or digital circuits, such as DSP, CPU, ASIC, memory, or other signal processing circuit. Semiconductor die 200 can also contain IPDs, such as inductors, capacitors, and resistors, for RF signal processing. A plurality of bumps 204 is formed over contact pads 205 on active surface 202, outside a footprint of semiconductor die 190, for electrical interconnect.

Semiconductor die 200 is mounted to semiconductor die 190. Semiconductor die 190 and 200 are mounted to a central region 206 of surface 174, as shown in FIG. 7b. Bumps 194 are electrically connected to contact pads 208 and conductive traces 172 on substrate 170 using reflow or solid-state bonding. Likewise, bumps 204 are electrically connected to contact pads 210 and conductive traces 172 on substrate 170 using reflow or solid-state bonding. In solid-state bonding, bumps 194 and 204 are thermo-mechanically connected to the contact pads by concurrently forcing the bumps against the contact pads and applying sufficient heat to deform the bumps against the pads without melting either the bump material or pad material. An underfill material or epoxy-resin adhesive material 212 is deposited between substrate 170 and semiconductor die 190 and 200.

Semiconductor die 190 has a smaller footprint as compared to semiconductor die 200 so that bumps 204 can be electrically connected to contact pads 210 around a peripheral region of semiconductor die 190. Semiconductor die 190 and 200 constitute an ultra thin package-on-package (PoP) arrangement mounted to substrate 170 between bumps 180. The combined height of semiconductor die 190 and 200 with bumps 194 and 204 is less than or equal to the height of bumps 180.

FIG. 7c shows substrate or PCB 224 with thermal conduction channels 226 routed through the PCB to conductive plane 225. The PoP and substrate structure 214 is inverted and positioned over thermal conduction channels 226. A thermal interface material (TIM) 220 is deposited over back surface 222 of semiconductor die 200, opposite semiconductor die 190. Alternatively, TIM 220 can be applied to thermal conduction channel 226 of PCB 224. The PoP and substrate structure 214 is mounted to thermal conduction channels 226 of PCB 224 with TIM 220, as shown in FIG. 7d. Bumps 180 are electrically connected to contact pads 227 on PCB 224. In one embodiment, semiconductor die 200 is a DSP, CPU, or other heat-generating signal processing die, and semiconductor die 190 is a memory supporting the DSP or CPU. Alternatively, semiconductor die 190 is the DSP, CPU, or other heat-generating signal processing die, and semiconductor die 200 is the memory supporting the DSP or CPU. In either case, semiconductor die 190 and 200 can operate with, for example, up to 5 watts of power consumption. Semiconductor die 190 and 200 are electrically connected through bumps 194 and 204, and conductive layers or traces 172 to PCB 224.

The heat generated by semiconductor die 190 and 200 is dissipated through TIM 220 and thermal conduction channels 226 to conductive plane 225. Conductive plane 225 can be securely mounted to equipment or chassis for further heat distribution. Conductive plane 225 can also serve as a ground plane for semiconductor die 190 and 200 to the equipment, as well as heat distribution. The PoP and substrate structure 214 can handle high power devices and provide effective heat dissipation with a high I/O count, all in an ultra thin PoP package.

In FIG. 7e, an optional ground plane 228 is formed over surface 176 of substrate 170. Ground plane 228 can be a continuous metal sheet, e.g., Cu, substantially covering surface 176. Ground plane 228 is electrically connected through conductive traces 172 and bumps 180 to a low-impedance ground point. Alternatively, a semiconductor die can be mounted to surface 176, as shown in FIGS. 5 and 6.

Figure 8A:
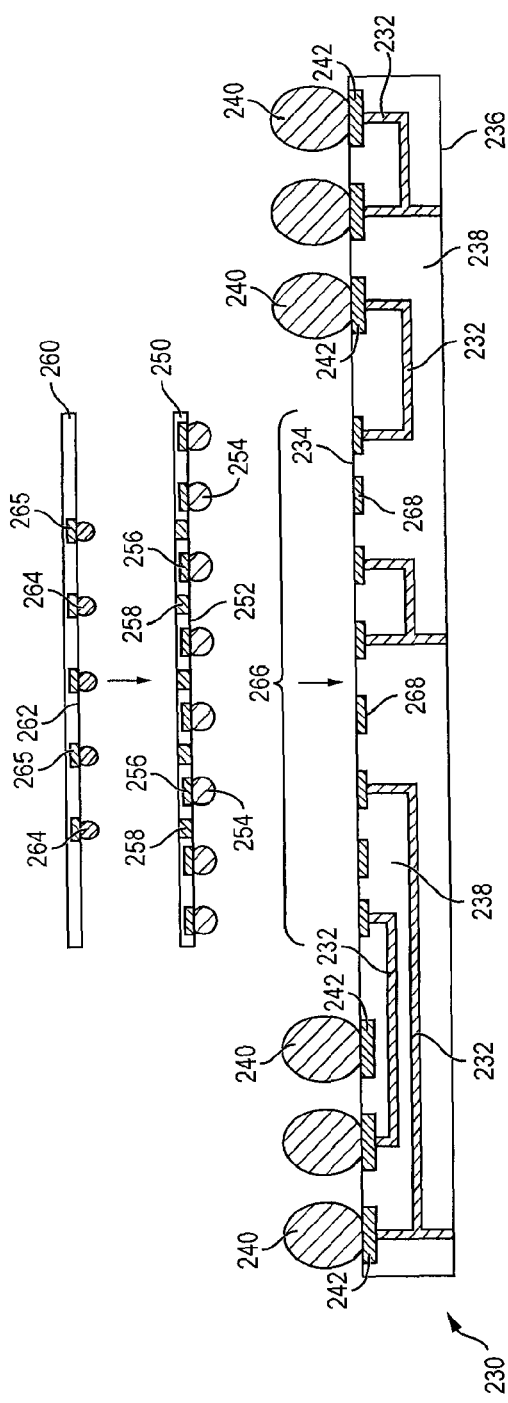

FIGS. 8a-8d illustrate, in relation to FIGS. 2 and 3a-3c, another process of dissipating heat from a thin PoP mounted to a substrate. FIG. 8a shows a substrate 230 having electrically conductive layers or traces 232 formed over and through the substrate to provide electrical interconnect according to the electrical design and function of semiconductor die 250 and 260. The conductive layers and traces 232 extend across substrate 230 and through the substrate between surface 234 and opposing surface 236 with electrical separation by insulating layer 238. A plurality of bumps 240 is formed over contact pads 242 on surface 234 of substrate 230 and electrically connected to conductive traces 232.

A semiconductor die 250 has an active surface 252 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 252 to implement analog circuits or digital circuits, such as DSP, CPU, ASIC, memory, or other signal processing circuit. Semiconductor die 250 can also contain IPDs, such as inductors, capacitors, and resistors, for RF signal processing. A plurality of bumps 254 is formed over contact pads 256 on active surface 252 for electrical interconnect.

A plurality of vias is formed through semiconductor die 250 using mechanical drilling, laser drilling, or deep reactive ion etching (DRIE). The vias are filled with Al, Cu, Sn, Ni, Au, Ag, titanium (Ti), tungsten (W), polysilicon, or other suitable electrically conductive material using electrolytic plating, electroless plating process, or other suitable metal deposition process to form z-direction conductive through silicon vias (TSV) 258.

A semiconductor die 260 has an active surface 262 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 262 to implement analog circuits or digital circuits, such as DSP, CPU, ASIC, memory, or other signal processing circuit. Semiconductor die 260 can also contain IPDs, such as inductors, capacitors, and resistors, for RF signal processing.

A plurality of bumps 264 is formed over contact pads 265 on active surface 262 for electrical interconnect.

Figure 8B:
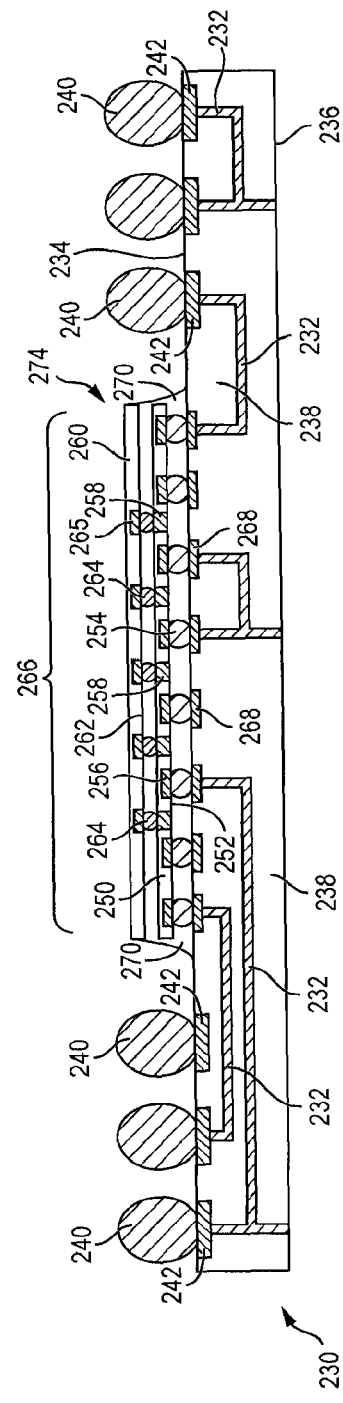

Semiconductor die 250 is mounted to a central region 266 of surface 234, as shown in FIG. 8b. Bumps 254 are electrically connected to contact pads 268 and conductive traces 232 on substrate 230 using reflow or solid-state bonding. Semiconductor die 260 is mounted to semiconductor die 250 with bumps 264 electrically connected to conductive TSV 258 using reflow or solid-state bonding. Semiconductor die 260 is further electrically connected through conductive TSV 258 and bumps 254 to contact pads 268 and conductive traces 232 on substrate 230. In solid-state bonding, bumps 254 and 264 are thermo-mechanically connected to the contact pads by concurrently forcing the bumps against the contact pads and applying sufficient heat to deform the bumps against the pads without melting either the bump material or pad material. Semiconductor die 260 has a substantially similar footprint as semiconductor die 250. An underfill material or epoxy-resin adhesive material 270 is deposited between substrate 230 and semiconductor die 250 and 260.

Semiconductor die 250 and 260 constitute an ultra thin PoP arrangement mounted to substrate 230 between bumps 240. The combined height of semiconductor die 250 and 260 with bumps 254 and 264 is less than or equal to the height of bumps 240.

FIG. 8c shows substrate or PCB 280 with thermal conduction channels 282 routed through the PCB to conductive plane 285. The PoP and substrate structure 274 is inverted and TIM 276 is deposited over back surface 278 of semiconductor die 260, opposite semiconductor die 250. Alternatively, TIM 276 can be applied to thermal conduction channel 282 of PCB 224. The PoP and substrate structure 274 is mounted to thermal conduction channels 282 of PCB 280 with TIM 276, as shown in FIG. 8d. Bumps 240 are electrically connected to contact pads 284 on PCB 280. In one embodiment, semiconductor die 260 is a DSP, CPU, or other heat-generating signal processing die, and semiconductor die 250 is a memory supporting the DSP or CPU. Alternatively, semiconductor die 250 is the DSP, CPU, or other heat-generating signal processing die, and semiconductor die 260 is the memory supporting the DSP or CPU. In either case, semiconductor die 250 and 260 can operate with, for example, up to 5 watts of power consumption. Semiconductor die 250 and 260 are electrically connected through conductive TSV 258, bumps 264, 254, and 240, and conductive layers or traces 232 to PCB 280.

The heat generated by semiconductor die 250 and 260 is dissipated through TIM 276 and thermal conduction channels 282 to conductive plane 285 for heat dissipation. Conductive plane 285 can be securely mounted to equipment or chassis for further heat distribution. Conductive plane 285 can also serve as a ground plane for semiconductor die 250 and 260 to the equipment, as well as heat distribution. The PoP and substrate structure 274 can handle high power devices and provide effective heat dissipation with a high I/O count, all in an ultra thin PoP package.

In another embodiment, FIG. 9a shows a substrate 290 having electrically conductive layers or traces 292 formed over and through the substrate to provide electrical interconnect according to the electrical design and function of semiconductor die 310. The conductive layers and traces 292 extend across substrate 290 and through the substrate between surface 294 and opposing surface 296 with electrical separation by insulating layer 298. A plurality of bumps 300 is formed over contact pads 302 on surface 294 of substrate 290 and electrically connected to conductive traces 292.

A semiconductor die 310 has an active surface 312 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 312 to implement analog circuits or digital circuits, such as DSP, CPU, ASIC, memory, or other signal processing circuit. Semiconductor die 310 can also contain IPDs, such as inductors, capacitors, and resistors, for RF signal processing. A plurality of bumps 314 is formed over contact pads 315 on active surface 312 for electrical interconnect. A second semiconductor die can be mounted to semiconductor die 310, similar to FIG. 8a.

A TIM 316 is formed over back surface 318 of semiconductor die 310 to aid with distribution and dissipation of heat generated by the semiconductor die. TIM 316 can be aluminum oxide, zinc oxide, boron nitride, or pulverized silver. An optional heat distributing layer 320 is mounted over TIM 316. Heat distributing layer 320 can be Cu, Al, or other material with high thermal conductivity.

Semiconductor die 310 with heat distributing layer 320 is mounted to a central region 322 of surface 294, as shown in FIG. 9b. Bumps 314 are electrically connected to contact pads 324 and conductive traces 292 on substrate 290 using reflow or solid-state bonding. In solid-state bonding, bumps 314 are thermo-mechanically connected to the contact pads by concurrently forcing the bumps against the contact pads and applying sufficient heat to deform the bumps against the pads without melting either the bump material or pad material. An underfill material or epoxy-resin adhesive material 326 is deposited between substrate 290 and semiconductor die 310. The combined height of semiconductor die 310 with bumps 314, TIM 316, and heat distributing layer 320 is less than or equal to the height of bumps 300.

FIG. 9c shows substrate or PCB 330 with thermal conduction channels 332 routed through the PCB to conductive plane 336. The semiconductor die and substrate structure 328 is inverted and mounted to PCB 330 with heat distributing layer 320 contacting thermal conduction channels 332. Bumps 300 are electrically connected to contact pads 334 on PCB 330, as shown in FIG. 9d. In one embodiment, semiconductor die 310 is a DSP, CPU, or other heat-generating signal processing die. In this case, semiconductor die 310 can operate with, for example, up to 5 watts of power consumption. Semiconductor die 310 is electrically connected through bumps 314 and 300 to conductive layers or traces 292 of PCB 330.

The heat generated by semiconductor die 310 is dissipated through TIM 316, heat distributing layer 320, and thermal conduction channels 332 to conductive plane 336 of PCB 330. The semiconductor die and substrate structure 328 can handle high power devices and provide effective heat dissipation with a high I/O count, all in an ultra thin PoP package.

FIG. 10a-10e shows an embodiment with a substrate 340 having electrically conductive layers or traces 342 formed over and through the substrate to provide electrical interconnect according to the electrical design and function of semiconductor die 360 and 370. The conductive layers and traces 342 extend across substrate 340 and through the substrate between surface 344 and opposing surface 346 with electrical separation by insulating layer 348. A plurality of bumps 350 is formed over contact pads 352 on surface 344 of substrate 340 and electrically connected to conductive traces 342.

A semiconductor die 360 has an active surface 362 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 362 to implement analog circuits or digital circuits, such as DSP, CPU, ASIC, memory, or other signal processing circuit. Semiconductor die 360 can also contain IPDs, such as inductors, capacitors, and resistors, for RF signal processing. A plurality of bumps 364 is formed over contact pads 366 on active surface 362 for electrical interconnect.

A plurality of vias is formed through semiconductor die 360 using mechanical drilling, laser drilling, or DRIE. The vias are filled with Al, Cu, Sn, Ni, Au, Ag, Ti, W, polysilicon, or other suitable electrically conductive material using electrolytic plating, electroless plating process, or other suitable metal deposition process to form z-direction conductive TSV 368.

A semiconductor die 370 has an active surface 372 containing analog or digital circuits implemented as active devices, passive devices, conductive layers, and dielectric layers formed within the die and electrically interconnected according to the electrical design and function of the die. For example, the circuit can include one or more transistors, diodes, and other circuit elements formed within active surface 372 to implement analog circuits or digital circuits, such as DSP, CPU, ASIC, memory, or other signal processing circuit. Semiconductor die 370 can also contain IPDs, such as inductors, capacitors, and resistors, for RF signal processing. A plurality of contact pads 374 is formed on active surface 372. Semiconductor die 370 is mounted to the back surface of semiconductor die 360 and electrically connected through conductive TSV 368 to bumps 364. Semiconductor die 360 and 370 can be similar size or different size, similar to FIGS. 7a and 8a.

Semiconductor die 360 and 370 are mounted to central region 376 of surface 344 of PCB 340, as shown in FIG. 10b. Bumps 364 are electrically connected to contact pads 378 and conductive traces 342 on substrate 340 using reflow or solid-state bonding. In solid-state bonding, bumps 364 are thermomechanically connected to the contact pads by concurrently forcing the bumps against the contact pads and applying sufficient heat to deform the bumps against the pads without melting either the bump material or pad material. An underfill material or epoxy-resin adhesive material 380 is deposited between substrate 340 and semiconductor die 360 and 370. In one embodiment, semiconductor die 370 is a DSP, CPU, or other heat-generating signal processing die, and semiconductor die 360 is a memory supporting the DSP or CPU. Alternatively, semiconductor die 360 is the DSP, CPU, or other heat-generating signal processing die, and semiconductor die 370 is the memory supporting the DSP or CPU. In either case, semiconductor die 360 or 370 can operate with, for example, up to 5 watts of power consumption. The combined height of semiconductor die 360 with bumps 364 and semiconductor die 370 is less than or equal to the height of bumps 350.

FIG. 10c shows substrate or PCB 384 with contact pads 386 connected to signal trace lines routed over surface 388 and within the layers of the PCB. Thermal conduction channels 390 are routed through PCB 384 to conductive plane 392 formed over surface 394 of the PCB opposite surface 388. A TIM 396 is deposited over surface 388 of PCB 340 in the area designated for mounting semiconductor die 360 and 370 to aid with distribution and dissipation of heat generated by the semiconductor die. TIM 396 can be aluminum oxide, zinc oxide, boron nitride, or pulverized silver. Alternatively, TIM 396 can be solder paste, heat-conductive polymer material, b-stage adhesive, thermal pad, or other thermal coupling agent.

FIG. 10d shows an embodiment with TIM 396 deposited over the back surface of semiconductor die 370.

Figure 10E:
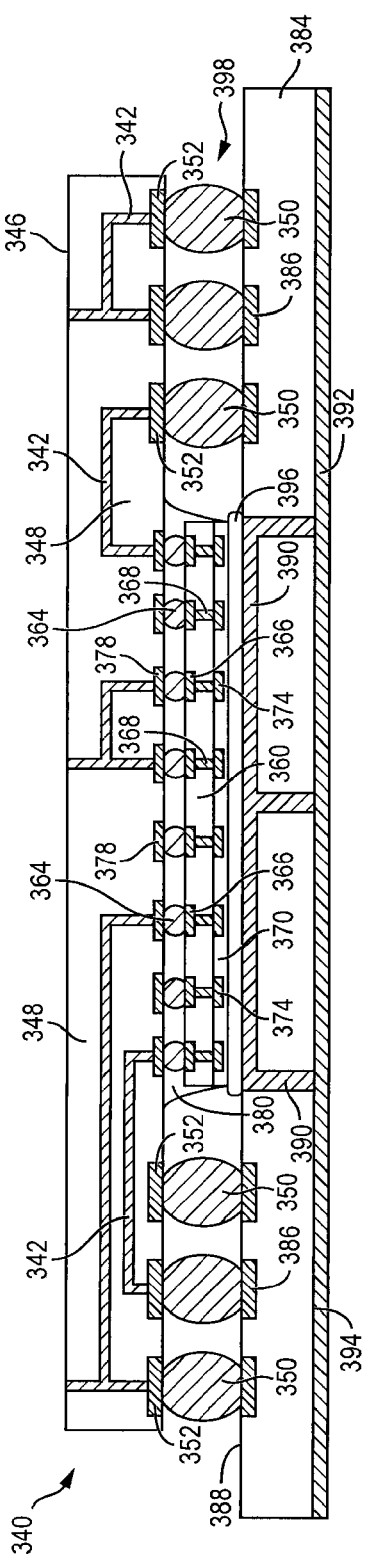

The semiconductor die and substrate structure 398 is inverted and mounted to substrate or PCB 340. The back surface of semiconductor die 370, opposite active surface 372, is thermally bonded to surface 388 of PCB 340 with TIM 396, as shown in FIG. 10e. In the case of solder paste, TIM 396 can be reflowed to molten state and then solidified to thermally bond the back surface of semiconductor die 370 to surface 388 of PCB 340. In the case of polymer, thermal pad, or b-stage material, the material can be cured to thermally bond the back surface of semiconductor die 370 to surface 388 of PCB 340. Bumps 350 are electrically connected to contact pads 386. Semiconductor die 360 and 370 are electrically connected through conductive TSV 368 and bumps 364 and 350 to conductive layers or traces 342 of PCB 340.

The heat generated by semiconductor die 360 and 370 is dissipated through TIM 396 and thermal conduction channels 390 to conductive plane 392 of PCB 340. Conductive plane 392 can be securely mounted to equipment or chassis for further heat distribution. Alternatively, a heat sink can be mounted to conductive plane 392. Conductive plane 392 can also serve as a ground plane for semiconductor die 360 and 370 to the equipment, as well as heat distribution. The semiconductor die and substrate structure 398 can handle high power devices and provide effective heat dissipation with a high I/O count, all in an ultra thin PoP package.

Figure 11:
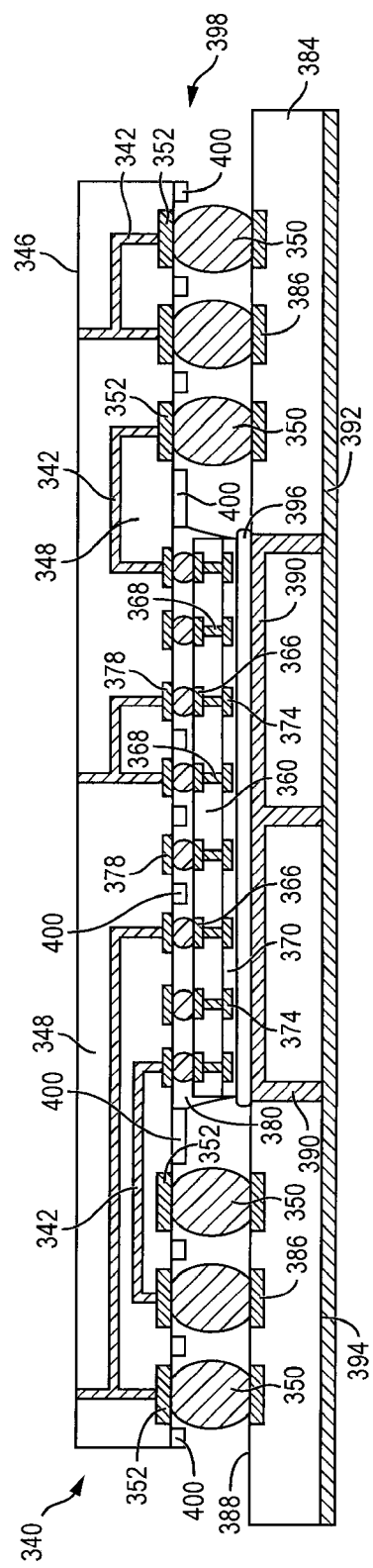
FIG. 11 illustrates a masking layer to contain underfill material.

FIG. 11 shows an embodiment, similar to FIG. 10e, with solder resist or masking layer 400. Masking layer 400 includes bump openings for bumps 350 and bumps 364 in an interior region of semiconductor die 360. The portion of masking layer 400 around bumps 364 around a perimeter of semiconductor die 364 is open. Masking layer 400 acts as resin dam to contain underfill material 380.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate having a central region;
   forming first bumps around a periphery of the central region of the first substrate;
   mounting a first semiconductor die to the central region of the first substrate;
   mounting an active surface of the second semiconductor die to the first semiconductor die over the central region of the first substrate, wherein a height of the first and second semiconductor die is less than or equal to a height of the first bumps;
   providing a second substrate having thermal conduction channels and a conductive plane, the thermal conduction channels disposed entirely within a central region of the second substrate, the thermal conduction channels including a horizontal channel disposed on a first surface of the second substrate and vertical channels disposed through the second substrate to contact the horizontal channel and the conductive plane, the conductive plane disposed on a second surface of the second substrate and spanning across a width of the central region of the second substrate;
   mounting a back surface of the second semiconductor die that is opposite the active surface of the second semiconductor die to the horizontal channel of the second substrate with a thermal interface material;

electrically connecting first contact pads disposed on the first substrate to second contact pads disposed on an active surface of the second semiconductor die using second bumps disposed between the first contact pads and second contact pads; and electrically connecting the first bumps to third contact pads disposed outside the central region and on the first surface of the second substrate.

2. A method of making a semiconductor device, comprising:

providing a first substrate;

mounting a first semiconductor die to the first substrate;

mounting an active surface of a second semiconductor die to the first semiconductor die over the first substrate;

forming bumps over the first substrate around a periphery of the first and second semiconductor die, wherein a height of the first and second semiconductor die is less than or equal to a height of the bumps;

providing a second substrate having thermal conduction channels disposed in a central region of the second substrate and a conductive plane, the thermal conduction channels including a horizontal channel disposed on a first surface of the second substrate and vertical channels disposed through the second substrate to contact the horizontal channel and the conductive plane, the conductive plane disposed on a second surface of the second substrate and spanning across a width of the central region of the second substrate; and mounting a back surface of the second semiconductor die opposite the active surface of the second semiconductor die to the horizontal channel of the second substrate with a thermal interface material.

3. A method of making a semiconductor device, comprising:

providing a first substrate;

mounting a first semiconductor die to the first substrate;

forming bumps over the first substrate around a periphery of the first semiconductor die, wherein a height of the first semiconductor die is less than or equal to a height of the bumps;

providing a second substrate having thermal conduction channels disposed in a central region of the second substrate and a conductive plane, the thermal conduction channels including a horizontal channel disposed entirely in the central region on a first surface of the second substrate and vertical channels disposed through the second substrate to contact the horizontal channel and the conductive plane, the conductive plane disposed on a second surface of the second substrate and spanning across an entire width of the horizontal channel; and mounting a surface of the first semiconductor die to the horizontal channel of the second substrate with a thermal interface material.

4. A method of making a semiconductor device, comprising:

providing a first substrate;

mounting a first semiconductor die to the first substrate;

forming first bumps over the first substrate around a periphery of the first semiconductor die, wherein a height of the first semiconductor die is less than or equal to a height of the first bumps;

providing a second substrate having thermal conduction channels, the thermal conduction channels including a horizontal channel disposed on a first surface of the second substrate and vertical channels disposed through the second substrate to contact the horizontal channel; and mounting a back surface of the first semiconductor die to the horizontal channel of the second substrate with a thermal interface material, the back surface of the first semiconductor die opposite an active surface of the first semiconductor die.

5. A method of making a semiconductor device, comprising:

providing a first substrate;

mounting a first semiconductor die to the first substrate;

forming first bumps over the first substrate around a periphery of the first semiconductor die, wherein a height of the first semiconductor die is less than or equal to a height of the first bumps;

providing a second substrate having thermal conduction channels, the thermal conduction channels including a horizontal channel disposed on a first surface of the second substrate and vertical channels disposed through the second substrate to contact the horizontal channel, wherein providing the second substrate comprises providing first contact pads on the first surface of the second substrate that are separated from the horizontal channel; and mounting a surface of the first semiconductor die to the horizontal channel of the second substrate with a thermal interface material.

6. A method of making a semiconductor device, comprising:

providing a first substrate;

mounting a first semiconductor die to the first substrate;

forming bumps over the first substrate and around the first semiconductor die;

providing a second substrate having thermal conduction channels and first contact pads disposed on a first surface of the second substrate, the thermal conduction channels including a horizontal channel disposed on the first surface of the second substrate and vertical channels disposed through the second substrate to contact the horizontal channel, the first contact pads separated from the horizontal channel; and mounting a surface of the first semiconductor die to the horizontal channel of the second substrate.

7. The method of claim 1, wherein the second semiconductor die has a larger footprint than the first semiconductor die.

8. The method of claim 1, further including forming a plurality of conductive vias through the first semiconductor die.

9. The method of claim 1, further including depositing an underfill material between the first substrate and first and second semiconductor die.

10. The method of claim 1, further including forming a masking layer over the first substrate.

11. The method of claim 2, wherein the thermal interface material includes solder paste, heat-conductive polymer material, or b-stage adhesive.

12. The method of claim 2, further including electrically connecting the bumps to contact pads on the second substrate.

13. The method of claim 2, further including forming a plurality of conductive vias through the first semiconductor die.

14. The method of claim 2, further including:
forming a masking layer over the first substrate; and
depositing an underfill material between the first substrate and first and second semiconductor die, the underfill material being contained by the masking layer.

15. The method of claim 2, wherein the second semiconductor die has a larger footprint than the first semiconductor die.

16. The method of claim 3, further including mounting a second semiconductor die to the first semiconductor die.

17. The method of claim 3, further including electrically connecting the bumps to contact pads on the second substrate.

18. The method of claim 3, further including depositing an underfill material between the first substrate and first semiconductor die.

19. The method of claim 16, wherein the second semiconductor die has a larger footprint than the first semiconductor die.

20. The method of claim 4, wherein mounting the back surface of the first semiconductor die to the horizontal channel comprises mounting the back surface of the first semiconductor die to the horizontal channel such that an entirety of the thermal conduction channels is disposed directly beneath the first semiconductor die.

21. The method of claim 4, wherein providing the second substrate comprises providing first contact pads on the first surface of the second substrate that are separated from the horizontal channel.

22. The method of claim 21, further comprising contacting the first bumps to the first contact pads.

23. The method of claim 22, further comprising electrically connecting second contact pads disposed on an active surface of the first semiconductor die with third contact pads disposed on the first substrate using second bumps.

24. The method of claim 5, further comprising contacting the first bumps to the first contact pads.

25. The method of claim 5, wherein mounting the surface of the first semiconductor die to the horizontal channel of the second substrate comprises mounting a back surface of the first semiconductor die to the horizontal channel of the second substrate, the back surface of the first semiconductor die opposite an active surface of the first semiconductor die.

26. The method of claim 24, further comprising electrically connecting second contact pads disposed on an active surface of the first semiconductor die with third contact pads disposed on the first substrate using second bumps.

27. The method of claim 25, wherein mounting the back surface of the first semiconductor die to the horizontal channel comprises mounting the back surface of the first semiconductor die to the horizontal channel such that an entirety of the thermal conduction channels is disposed directly beneath the first semiconductor die.

28. The method of claim 6, wherein a height of the first semiconductor die is less than or equal to a height of the bumps.

29. The method of claim 6, wherein providing the second substrate includes providing a conductive plane on a second surface of the second substrate that is opposite the first surface of the second substrate.

30. The method of claim 6, wherein mounting the surface of the first semiconductor die to the horizontal channel includes mounting with a thermal interface material.

31. The method of claim 6, wherein an entirety of the vertical channels is disposed directly beneath the horizontal channel.

32. The method of claim 29, wherein a width of the conductive plane is greater than a width of the horizontal channel.

33. The method of claim 32, wherein the horizontal channel is disposed directly over a center of the substrate.

* * * * *